(12) United States Patent
Tran et al.

(10) Patent No.: US 10,978,553 B2
(45) Date of Patent: Apr. 13, 2021

(54) FORMATION OF A CAPACITOR USING A HARD MASK

(71) Applicant: Micron Technology, Inc., Boise, ID (US)

(72) Inventors: Diem Thy N. Tran, Garden City, ID (US); Devesh Dadhich Shreeram, Boise, ID (US); Sanjeev Sapra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 16/259,131

(22) Filed: Jan. 28, 2019

(65) Prior Publication Data
US 2020/0243640 A1 Jul. 30, 2020

(51) Int. Cl.
*H01L 49/02* (2006.01)
*H01L 27/108* (2006.01)
*H01G 4/08* (2006.01)

(52) U.S. Cl.
CPC ............... *H01L 28/92* (2013.01); *H01G 4/08* (2013.01); *H01L 27/10829* (2013.01); *H01L 27/10861* (2013.01); *H01L 28/91* (2013.01)

(58) Field of Classification Search
CPC ............ H01L 29/945; H01L 29/66181; H01L 28/90–92; H01L 27/10861; H01L 27/10829; H01L 28/91; H01L 28/92
See application file for complete search history.

(56) References Cited

U.S. PATENT DOCUMENTS

| 7,226,845 B2* | 6/2007 | Manning ........... H01L 27/10852 257/296 |
| 7,662,693 B2 | 2/2010 | Bhattacharyya |
| 7,875,529 B2 | 1/2011 | Forbes et al. |
| 7,875,733 B2 | 1/2011 | Forbes et al. |
| 8,274,777 B2 | 9/2012 | Kiehlbauch |
| 8,652,926 B1* | 2/2014 | Lugani ................ H01L 21/3065 438/396 |
| 2004/0157459 A1* | 8/2004 | Ying ................. H01L 27/11585 438/706 |
| 2006/0134854 A1* | 6/2006 | Park .................. H01L 27/10852 438/239 |
| 2007/0123017 A1* | 5/2007 | Sadjadi ............. H01J 37/32642 438/597 |

(Continued)

*Primary Examiner* — Laura M Menz
*Assistant Examiner* — Khatib A Rahman
(74) *Attorney, Agent, or Firm* — Brooks, Cameron & Huebsch, PLLC

(57) ABSTRACT

Methods, apparatuses, and systems related to forming a capacitor using a hard mask material are described. An example method includes patterning a surface to have a first silicate material, a first nitride material on the first silicate material, a second silicate material on the first nitride material, a second nitride material on the second silicate material, and a sacrificial material on the second nitride material. The method further includes forming a hard mask material on the sacrificial material. The method further includes forming a capacitor material in an opening through the first silicate material, the first nitride material, the second silicate material, the second nitride material, the sacrificial material, and the hard mask material. The method further includes removing the sacrificial material and the hard mask material.

26 Claims, 11 Drawing Sheets

(56) References Cited

U.S. PATENT DOCUMENTS

| | | | | |
|---|---|---|---|---|
| 2007/0238259 A1* | 10/2007 | Bhat | ........................ | H01L 28/91 438/381 |
| 2009/0047769 A1* | 2/2009 | Bhat | .................. | H01L 27/10852 438/387 |
| 2009/0251845 A1* | 10/2009 | Kiehlbauch | ............ | H01G 4/012 361/301.1 |
| 2010/0009512 A1* | 1/2010 | Fishburn | ........... | H01L 27/10817 438/399 |
| 2010/0062579 A1* | 3/2010 | Juengling | ........... | H01L 29/0649 438/424 |
| 2010/0173491 A1* | 7/2010 | Iba | .................... | H01L 21/31116 438/637 |
| 2010/0266962 A1* | 10/2010 | Fishburn | ........... | H01L 27/10817 430/319 |
| 2012/0040507 A1* | 2/2012 | Lee | .................. | H01L 27/10817 438/381 |
| 2015/0348963 A1* | 12/2015 | Hung | ................ | H01L 27/10852 257/532 |
| 2017/0345886 A1* | 11/2017 | Yi | ..................... | H01L 27/10814 |

* cited by examiner

US 10,978,553 B2

FORMATION OF A CAPACITOR USING A HARD MASK

TECHNICAL FIELD

The present disclosure relates generally to semiconductor devices and methods, and more particularly to formation of a capacitor using a hard mask.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAIVI), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
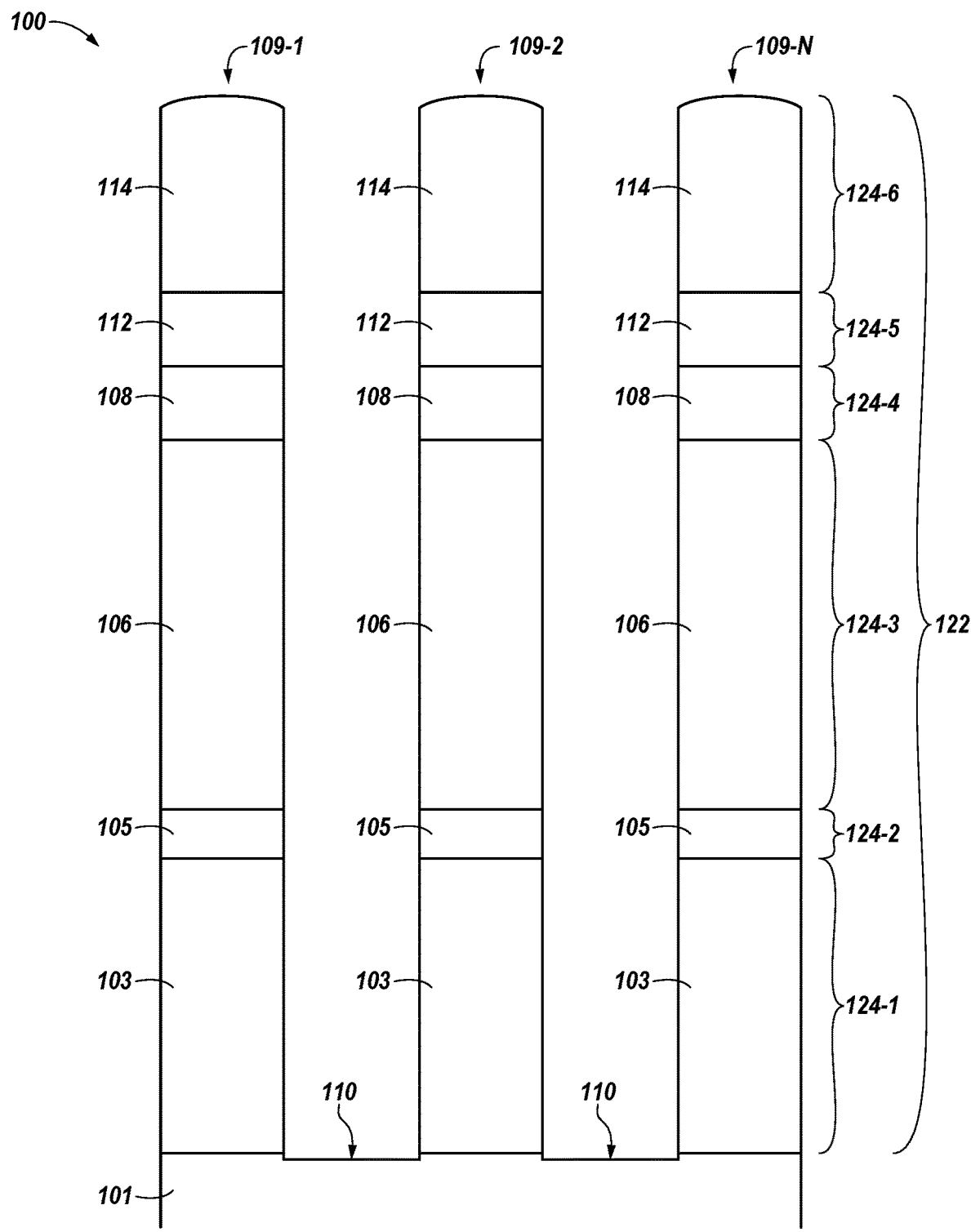
FIGS. 1-6 illustrate cross-sectional views of a portion of an example memory device at stages of an example fabrication sequence for formation of a capacitors using a hard mask in accordance with a number of embodiments of the present disclosure.

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a substrate. Such openings may contain, or be associated with, various materials that contribute to data access, storage, and/or processing, or to various support structures, on the memory device.

In one example process, a trench may be formed through one or more layers of materials to receive subsequent processing steps to form a discrete device such as a storage node, e.g., vertical capacitor to a dynamic random access memory (DRAM) cell. Embodiments are not limited to this example. As design rules scale to smaller dimensions, deeper trenches with more narrow widths may be desired. In addition, in order to increase the capacitance of a cell of the memory device, a surface area of the capacitor material formed into a column can be increased by increasing the height of the capacitor material column within the opening. However, due to possible gap margins and smaller pitch, increasing the height of a capacitor column can increase the risk of bending and wobbling of the capacitor column, causing possible shorts.

In order to mitigate this issue, a method for forming a capacitor using a hard mask is described further below. As an example, a capacitor can include a mid lattice portion and a top lattice portion including oxides (TEOS and BPSG) in between the mid lattice and top lattice portions. This dual lattice structure can include an amount of recess material (e.g., hard mask, and/or a sacrificial layer of Nitride or Oxide) above the top lattice. Positioning a hard mask and/or a sacrificial layer above a top lattice can reduce bending of the capacitors by reducing stress on the BPSG/TEOS of the lattice portions. In addition, adding a hard mask above the sacrificial layer can add additional height to the capacitor material, thereby increasing the capacitor's capacitance.

The present disclosure includes methods, apparatuses, and systems related to forming a capacitor using a hard mask. An example of a method described herein includes forming a number of materials on a substrate material. The number of materials can include a silicate material, a nitride material, a sacrificial material, and/or a hard mask deposited on a substrate. The example method further includes removing the sacrificial layer and/or the hard mask and leaving a nitride material and a silicate material as support for a capacitor material.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 112 may reference element "12" in FIG. 1, and a similar element may be referenced as 212 in FIG. 2. In some instances, a plurality of similar, but functionally and/or structurally distinguishable, elements or components in the same figure or in different figures may be referenced sequentially with the same element number (e.g., 124-1, 124-2, 124-3, 124-4, 124-5 in FIG. 1).

FIG. 1 illustrates a cross-sectional view 100 of a portion of an example memory device at a particular stage in an example semiconductor fabrication sequence for forming a capacitor using a hard mask material in accordance with a number of embodiments of the present disclosure. The example memory device 100 can include a plurality of pillars 109-1, 109-2, . . . , 109-N (hereinafter referred to collectively as plurality of materials 109) used to form semiconductor structures to a memory device 100. In the example pillar structure shown in FIG. 1 each of the plurality of pillars 109 can include a first silicate material 103, shown to have been formed over an underlying substrate material 101. The substrate material 101 may be formed from various undoped or doped materials on which memory device materials may be fabricated. Examples of a relatively inert undoped substrate material 101 may include monocrystalline silicon (monosilicon), polycrystalline silicon (polysilicon), and amorphous silicon, among other possibilities.

The first silicate material 103 may, in a number of embodiments, have been formed from a borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, formation, and/or removal of the first silicate material 103, as described herein.

The first silicate material 103 may be originally formed (e.g., deposited) as a continuous, or first continuous, layer, e.g., a layer in one deposition or processing sequence on a surface 110 of the underlying substrate material 101. For example, the first silicate material 103 may be formed without an opening formed therein from an upper surface of the first silicate material 103 to the surface 110 of the underlying substrate material 101. The layer of the first silicate material 103 may, in a number of embodiments, be deposited to a thickness in a range of from around 400 nanometers (nm) to around 750 above the surface 110 of the underlying substrate material 101. Embodiments, however, are not limited to these examples.

Next, within a pillar 109, a first nitride material 105 is shown to have been formed over a surface of the first silicate material 103 opposite from the underlying substrate material 101. The first nitride material 105 may be formed (e.g., deposited) as a continuous, or second continuous, layer, e.g., a layer in one deposition or processing sequence on an upper surface of the first silicate material 103. Alternatively, the first nitride material 105 may be formed (e.g., deposited) as two separate portions (e.g., layers) on the upper surface of the first silicate material 103. For example, the first silicate material 103 may be formed with an opening (such as the opening illustrated between pillars 109-1 and 109-2 in FIG. 1, illustrated as pillars in this 2-dimensional format but not necessarily pillars in a 3-dimensional format, for example) formed therein from an upper surface of the first nitride material 105 to an upper surface of the first silicate material 103.

The first nitride material 105 may be formed from a nitride material selected for dielectric or resistance properties. For example, one or more dielectric and/or resistor nitrides may be selected from boron nitride (BN), silicon nitride ($SiN_x$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material 105. The first nitride material 105 may, in a number of embodiments, be deposited to a thickness in a range of from around 15 nm to around 30 nm above the surface of the first silicate material 103.

A second silicate material 106 is shown to have been formed over a surface of the first nitride material 105 opposite from the first silicate material 103. The second silicate material 106 may be formed (e.g., deposited) as a continuous, or third continuous, layer, e.g., a layer in one deposition or processing sequence on an upper surface of the first nitride material 105. The second silicate material 106 may, in a number of embodiments, be formed from tetraethyl orthosilicate ($Si(OC_2H_5)_4$), which is also referred to as TEOS. TEOS may be formed as an ethyl ester of orthosilicic acid ($Si(OH)_4$), among other possibilities.

A second nitride material 108 is shown to have been formed over a surface of the second silicate material 106 opposite from first nitride material 105. The second nitride material 108 may be formed (e.g., deposited) as a continuous, or fourth continuous, layer, e.g., a layer in one deposition or processing sequence on an upper surface of the second silicate material 106.

Similar to the first nitride material 105, the second nitride material 108 may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the second nitride material 108. In various embodiments, the first nitride material 105 and the second nitride material 108 may be formed from a same nitride or a same mixture of nitrides or the first and second nitride materials 105, 108 each may be formed from a different nitride or a different mixture of nitrides dependent upon, for example, various uses to which the nitrides may be applied. The second nitride material 108 may, in a number of embodiments, be deposited to a thickness in a range of from around 80 nm to around 150 nm above the surface of the second silicate material 106.

A sacrificial material 112 may be formed over a surface of the second nitride material 108 opposite from the second silicate material 106. The sacrificial material 112 may be formed (e.g., deposited) as a continuous, or fifth continuous, layer, e.g., a layer in one deposition or processing sequence on an upper surface of the second nitride material 108. In at least one embodiment, the sacrificial material 112 may be a third nitride material. In at least one embodiment, the sacrificial material 112 can be a different nitride material than the second nitride material 108. In at least one embodiment, the sacrificial material 112 can be a same nitride material than the second nitride material 108.

Similar to the first nitride material 105 and the second nitride material 108, the sacrificial material 112 may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the sacrificial material 108. In various embodiments, the first nitride material 105, the second nitride material 108, and the sacrificial material 112 may be formed from a same nitride or a same mixture of nitrides or the first and second nitride materials 105, 108 and the sacrificial material 112 each may be formed from a different nitride or a different mixture of nitrides dependent upon, for example, various uses to which the nitrides may be applied. The sacrificial material 112 may, in a number of embodiments, be deposited to a thickness in a range of from around 80 nm to around 150 nm above the surface of the second nitride material 108.

A hard mask material 114 may be formed over a surface of the sacrificial material 112. The hard mask material 114 may be formed (e.g., deposited) as a continuous, or sixth continuous, layer, e.g., a layer in one deposition or processing sequence on an upper surface of the sacrificial material 112. In at least one embodiment, the hard mask material 114 may be a material that does not etch faster when exposed to plasma based etching. A hard mask material can be a material used to protect an area beneath from etching when exposed to plasma based etching. This can allow for control of critical dimensions of capacitors. As an example, the hard mask material can be poly silicon, carbon, metals, nitride, etc. In one example, a hard mask material can be highly selective to oxide or nitride that is positioned below the hard mask material. High selectivity to etching chemistry can allow lateral etching, i.e., without etching side-ways. Sideway etching could cause an increase in critical dimensions of a capacitor material. In one example, the hard mask material 114 can be deposited to a height of approximately 1,200 Angstroms. In at least one embodiment, the hard mask material 114 can be a different nitride material than the second nitride material 108. In at least one embodiment, the hard mask material 114 can be a same nitride material as the sacrificial material 112.

An etch process (e.g., a first wet etch process or dry etch process) may be utilized to etch into (e.g., through) the hard mask material 114, the sacrificial material 112, the second nitride material 108, the second silicate material 106, the first nitride material 105, and/or the first silicate material 103 to form an opening within the previously listed materials (as is illustrated already between pillars 109-1 and 109-2). Performance of the etch process may result in formation of an opening within various combinations of the pillars 109-1 in order to form a resultant opening that extends from the upper surface of the sacrificial material 112 to the surface 110 of the substrate material 101. The resultant opening may have a height 122 in a range of from around 8,000 Angstroms (or 800 nm) to around 15,000 Angstroms (or 1,500 nm). Each of the materials can contribute a particular height to the overall height 122 of the structure. As an example, the first silicate material 103 can have a height 124-1, the first nitride material can have a height 124-2, the second silicate material 106 can have a height 124-3, the second nitride material 108 can have a height 124-4, the sacrificial material 112 can have a height 124-5, and the hard mask material 114 can have a height 124-6, that, when added together, results in the overall height 122.

In some embodiments, the height 124-1 of the first silicate material 103 can be one of approximately 4800 Angstroms, approximately 5000 Angstroms, approximately 5300 Angstroms, approximately 5700 Angstroms, and/or within a range from 3000-7000 Angstroms. In some embodiments, the height 124-2 of the first nitride material 105 can be one of approximately 100 Angstroms, approximately 200 Angstroms, approximately 300 Angstroms, and/or within a range from 100-500 Angstroms. In some embodiments, the height 124-3 of the second silicate material 106 can be one of approximately 4800 Angstroms, approximately 5000 Angstroms, approximately 5300 Angstroms, approximately 5700 Angstroms, and/or within a range from 3000-7000 Angstroms. In some embodiments, the height 124-4 of the second nitride material 108 can be one of approximately 200 Angstroms, approximately 400 Angstroms, approximately 800 Angstroms, and/or within a range from 200-1500 Angstroms. In some embodiments, the height 124-5 of the sacrificial material 112 can be one of approximately 200 Angstroms, approximately 400 Angstroms, approximately 700 Angstroms, approximately 800 Angstroms, and/or within a range from 200-1500 Angstroms. In some embodiments, the height 124-6 of the hard mask material 114 can be one of approximately 800 Angstroms, approximately 1000 Angstroms, approximately 1200 Angstroms, approximately 1500 Anstroms, and/or within a range of 500-1500 Angstroms. Embodiments are not limited to these examples.

In at least one embodiment, the width or diameter of the opening between pillars 109-1 and 109-2 can be within a range of from around 200-600 Angstroms (or 20 to 60 nm) and the height of the opening can be within a range of from around 8,000-15,000 Angstroms (800-1,500 nm) and may result in an aspect ratio (AR) of the height to width being in a range of from around 25:1 to around 50:1 as the etch progresses through the first silicate material 103 and approaches the substrate material 101.

As the height 122 of the pillars 109-1 to 109-N increases, a bending and/or leaning of the pillars 109 can occur. In some embodiments, a support structure may be formed for the second silicate material 106 stacked on the first silicate material 103 adjacent the substrate material 101 in order to minimize this bending and/or leaning. The support structure may, in a number of embodiments, be formed by forming (e.g., depositing) the first nitride material 105 between the first silicate material 103 and the second silicate material 106 and forming the second nitride material 108 on an opposite surface of the second silicate material 106. The first and second nitride materials 105, 108 may form the support structure by extending between and connecting (e.g., attaching) to features associated with multiple capacitors (e.g., as shown and described in connection with FIGS. 4-6) or other structural elements of the example memory device. A support structure formed as such may enable a stack of the first and the second silicate materials 103, 106 to be maintained in a more static configuration relative to each other and the underlying substrate material 101 than provided by the first and the second silicate materials 103, 106 themselves.

However, this support structure may minimize an amount of surface area for contact with a capacitor, thereby decreasing efficiency of the capacitor. In order to prevent this, a hard mask material 114 and a sacrificial material 112 can be applied in order to provide a structure for increasing the height of the capacitor and subsequently removing the hard mask material 114 and the sacrificial material 112 in order to increase a surface area of contact of the capacitor, as will be described further in association with FIGS. 2-6.

Figure 2:
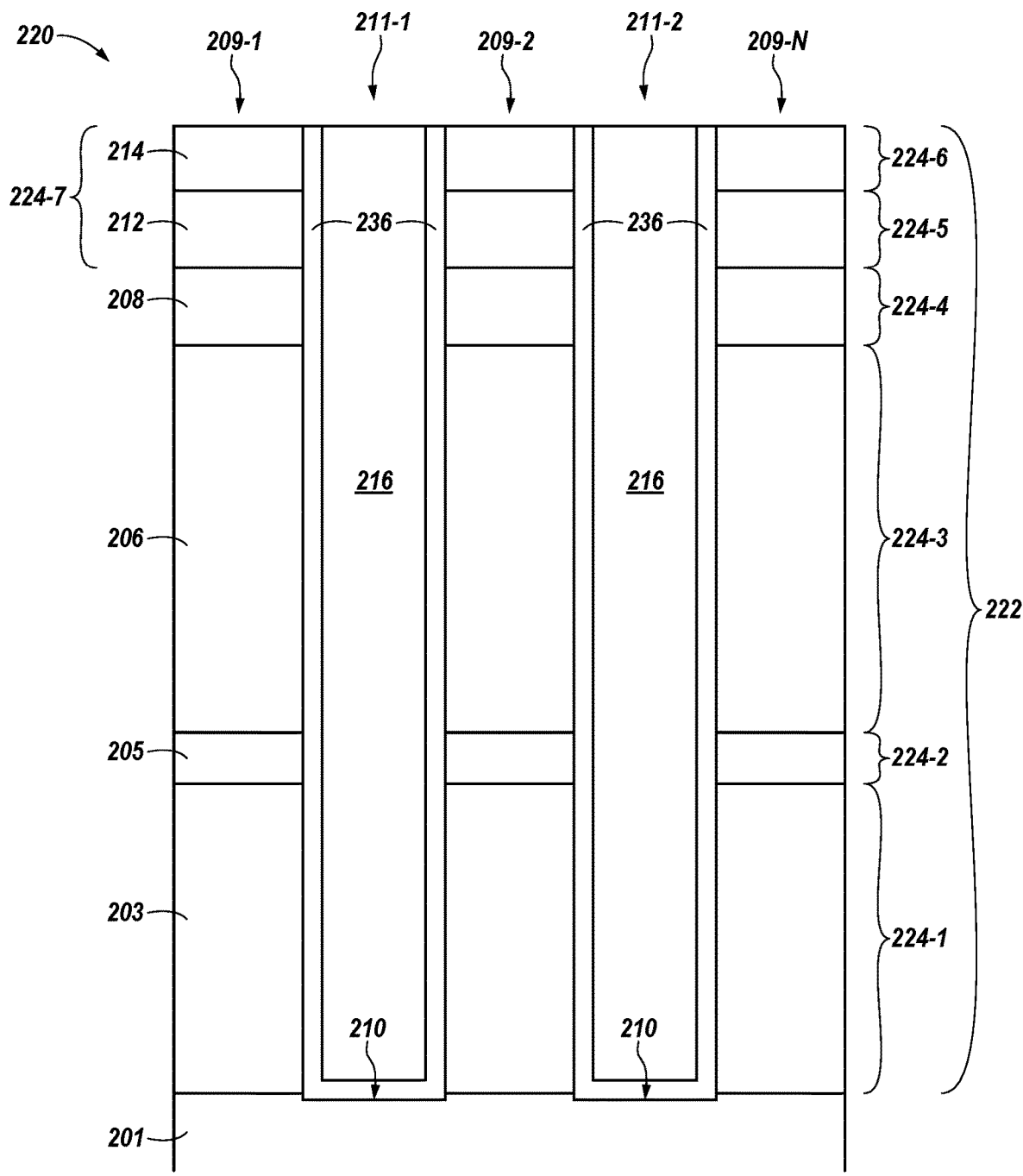

FIG. 2 illustrates a cross-sectional view 220 of a portion of an example memory device at a particular stage in an example fabrication sequence for formation of a capacitor in association with an opening in accordance with a number of embodiments of the present disclosure. FIG. 2 illustrates a structure of the portion of the example memory device at a stage in time following completion of the fabrication sequence described in connection with FIG. 1.

As described in connection with FIG. 1, a first nitride material 205 may be formed (e.g., deposited) between the first silicate material 203 and the second silicate material 206. A second nitride material 208 also may be formed (e.g., deposited) on a second silicate material 506 and a sacrificial material 212 may be formed (e.g., deposited) on the second nitride material 208. A hard mask material 214 may be formed over the sacrificial material 212. An opening 211-1 between pillars 209-1 and 209-2 may extend from the substrate material 201 to the hard mask material 214. For clarity in the example fabrication sequence, FIG. 2 shows a first opening 211-1 and a second opening 211-1 in the portion of the example memory device, although embodiments are not limited to two openings and may include a number of such openings.

As shown in FIG. 2, the hard mask material 214 (e.g., hard mask material 114 in FIGS. 1 and 214 in FIG. 2) can be removed from the portion of the example memory device shown in FIG. 2. A portion of the hard mask material 214 may be removed with (via application of) a solvent that is selective for removing (e.g., dissolving) the hard mask material 214 from the memory device while not removing (e.g., leaving) other portions of the hard mask materials 214 along with other materials such that those materials remain in the memory device (such as not removing the first silicate material 203, the first nitride material 205, the second silicate material 206, the second nitride material 208, the sacrificial layer 212, and a portion of the hard mask material 214). Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), ammonium hydroxide ($NH_4OH$), tetramethylammonium hydroxide (TMAH), nitric acid ($HNO_3$), hydrogen chloride (HCL), hydrogen peroxide ($H_2O_2$), potassium hydroxide (KOH), phosphoric acid, hot hydrofluoric acid (HF), cold HF, and combinations thereof, among other possibilities. In one example, the hard mask material 214 can be removed by etching the bottom nitride (recess nitride) directly. This can allow reduction of residue that may result from etching with chemistry.

In some embodiments, a chemical mechanical planarization (CMP) and/or an alligator cut can be used to planarize and reduce a portion of the hard mask material (e.g., hard mask material 114 in FIG. 1) to a height of the hard mask material 214 in FIG. 2. An alligator cut can refer to a dry etch plasma based process that is non-selective to nitride, oxide, poly-silicon, metals, and/or carbon which can allow for an etch and planarizing of the surface. CMP is an alternative process that can also mechanically polish the surface and can be non-selective to nitride, oxide, poly-silicon, metals, and/or carbon. CMP can refer to a process of smoothing surfaces with a combination of chemical and mechanical forces. It may include a hybrid of chemical etching and/or free abrasive polishing. CMP can use an abrasive and/or corrosive chemical slurry in conjunction with a polishing pad and retaining ring, typically of a greater diameter than a semiconductor wafer. The pad and wafer may be pressed together by a dynamic polishing head and held in place by a plastic retaining ring. The dynamic polishing head can be rotated with different axes of rotation which can remove material and tends to even out irregular topography, making it flat or planar. As an example, CMP can bring an entire surface within a depth of field of a photolithography system, or can selectively remove material based on its position.

The reduction of the hard mask material can reduce the height of the hard mask material from 1200 Angstroms to 500 Angstroms. In some embodiments, the height of the hard mask material can be reduced from a range of 1000-2000 Angstroms to a height in a range from 200-1000 Anstroms. The remaining hard mask material can provide additional height to a capacitor material that is deposited, as will be described further below.

The portion of the hard mask material 214 removed can include removing a height of between 500-1000 Angstroms from the hard mask material 214. As an example, the height 124-6 of the hard mask material 114 in FIG. 1 can be 1200 Angstroms while the height 224-6, subsequent to the removal of the portion of the hard mask material 214, can be 700 Angstroms. Further, the height 124-6 of the hard mask material 214 prior to removal can be from a range of 500-1500 Angstroms and the height 224-6 of the had mask material 214 subsequent to removal of the portion can be from a range of 500-1200 Angstroms. In this way, a height of a capacitor material 216, whose deposition will be described, can be increased.

As shown in FIG. 2, subsequent to removal of the portion of the hard mask material 216, a first electrode material 236 may be formed (e.g., deposited) on the surface 210 of the substrate material 201 and on the sidewalls of the openings 211-1 and 211-2. In a number of embodiments, the first electrode material 236 also may have been formed over the upper surface of the second nitride material 208. As is illustrated in FIG. 2, a capacitor material 216 is shown as having been formed (e.g., deposited) to fill the openings 211-1, 211-2 from the substrate material 201 to a height 222 of the opening 211 at the upper surface of the second nitride material 208. Each of the materials can contribute a particular height to the overall height 222 of the structure. As an example, the first silicate material 203 can have a height 224-1, the first nitride material can have a height 224-2, the second silicate material 206 can have a height 224-3, the second nitride material 208 can have a height 224-4, the sacrificial layer 212 can have a height 224-5, and the portion of the hard mask material 214 left after removal can have a height 224-6 that, when added together, results in the overall height 222.

In a number of embodiments, the capacitor material 216 may be deposited to fill the openings 211-1, 211-2 to an upper surface of the first electrode material 236, that is to extend from the substrate 201 to the top edge of the portion of the hard mask material 214 in FIG. 2 (represented by height 222). The first electrode material 236 and the capacitor material 216 may be formed from various conductive materials and to various widths (e.g., thicknesses) as suited to a particular design rule for the formation of an operable capacitor for a semiconductor device.

In some embodiments, the application of the selective solvent may leave the capacitor material 216 having the first electrode material 236 formed over an outer surface thereof remaining in the structure of the memory device. In addition, the first silicate material 203, the first nitride material 205, the second silicate material 206, the second nitride material 208, the sacrificial material 212, and a portion of the hard mask material 214 may be left remaining following the application of the selective solvent, among other possible components or structural features that may remain in the structure of the memory device. At the conclusion of the removal of the portion of the hard mask material 214, a height of the hard mask material 214 and the sacrificial material 212 combined can have a height 224-7 (which combines height 224-5 of the sacrificial material 212 with height 224-6 of the portion of the hard mask material 214 remaining).

Figure 3:
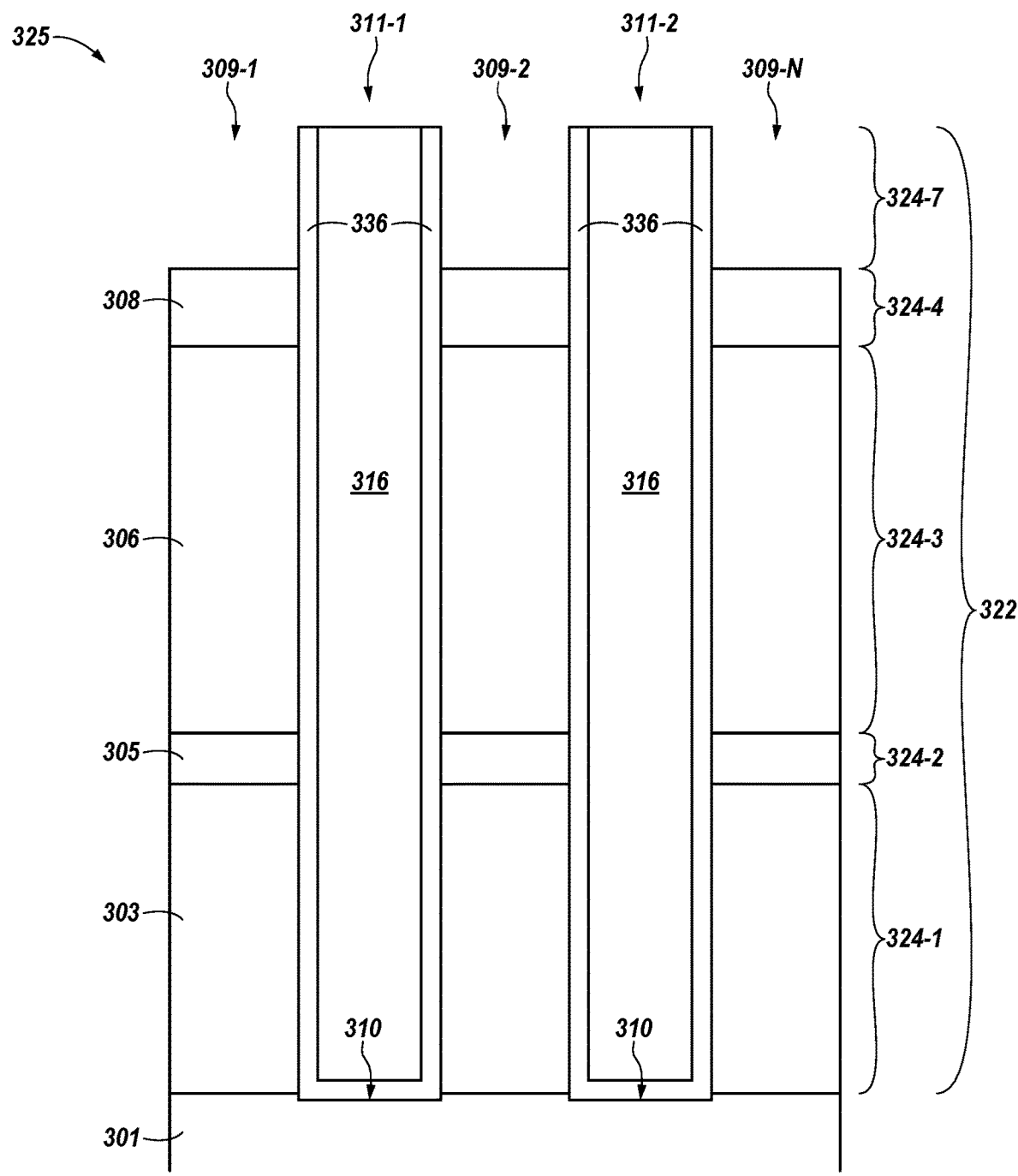

FIG. 3 illustrates a cross-sectional view 325 of a portion of an example memory device at a particular stage in the example fabrication sequence for formation of a capacitor in accordance with a number of embodiments of the present disclosure. FIG. 3 illustrates a structure of the portion of the example memory device at the particular stage following completion of the example fabrication sequence described in connection with FIGS. 1-2.

As shown in FIG. 3, the sacrificial material (e.g., sacrificial material 112 in FIGS. 1 and 212 in FIG. 2) and the portion of the hard mask material (e.g., portion of hard mask material 214 in FIG. 2) has been removed from the portion of the example memory device shown in FIG. 2. The hard mask material and the sacrificial material may be removed with (via application of) a solvent that is selective for removing (e.g., dissolving) the sacrificial material from the memory device while not removing (e.g., leaving) other materials such that those materials remain in the memory device (such as not removing the first silicate material 303, the first nitride material 305, the second silicate material 306, and the second nitride material 308). Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), ammonium hydroxide ($NH_4OH$), tetramethylammonium hydroxide (TMAH), nitric acid ($HNO_3$), hydrogen chloride (HCL), hydrogen peroxide ($H_2O_2$), potassium hydroxide (KOH), phosphoric acid, hot hydrofluoric acid (HF), cold HF, and combinations thereof, among other possibilities. Removal of the hard mask material and the sacrificial material may leave empty spaces (e.g., voids) in the structure of the memory device that expose a top portion 315 of the first electrode material 336, thereby increasing an exposed surface area of the first electrode material 336.

In contrast, the application of the selective solvent may leave the capacitor material 316 having the first electrode material 336 formed over an outer surface thereof remaining in the structure of the memory device. In addition, the first silicate material 303, the first nitride material 305, the second silicate material 306, and the second nitride material 308 may be left remaining following the application of the selective solvent, among other possible components or structural features that may remain in the structure of the memory device.

As is illustrated in FIG. 3, the first silicate material 303 can have a height 324-1, the first nitride material can have a height 324-2, the second silicate material 306 can have a height 324-3, the second nitride material 308 can have a height 324-4, and the height 324-7 of the hard mask material and the sacrificial material combined (although removed at this stage) that, when added together, results in the overall height 322.

While the example in association with FIG. 3 describes removing the hard mask material and the sacrificial material prior to removal of the first silicate material 303 and the second silicate material 306, examples are not so limited. In at least one example, the first silicate material 303 and the second silicate material 306 can be removed prior to removal of the hard mask material and the sacrificial material (e.g., the process described in association with FIG. 4 may be performed prior to the process described in association with FIG. 3).

Figure 4:
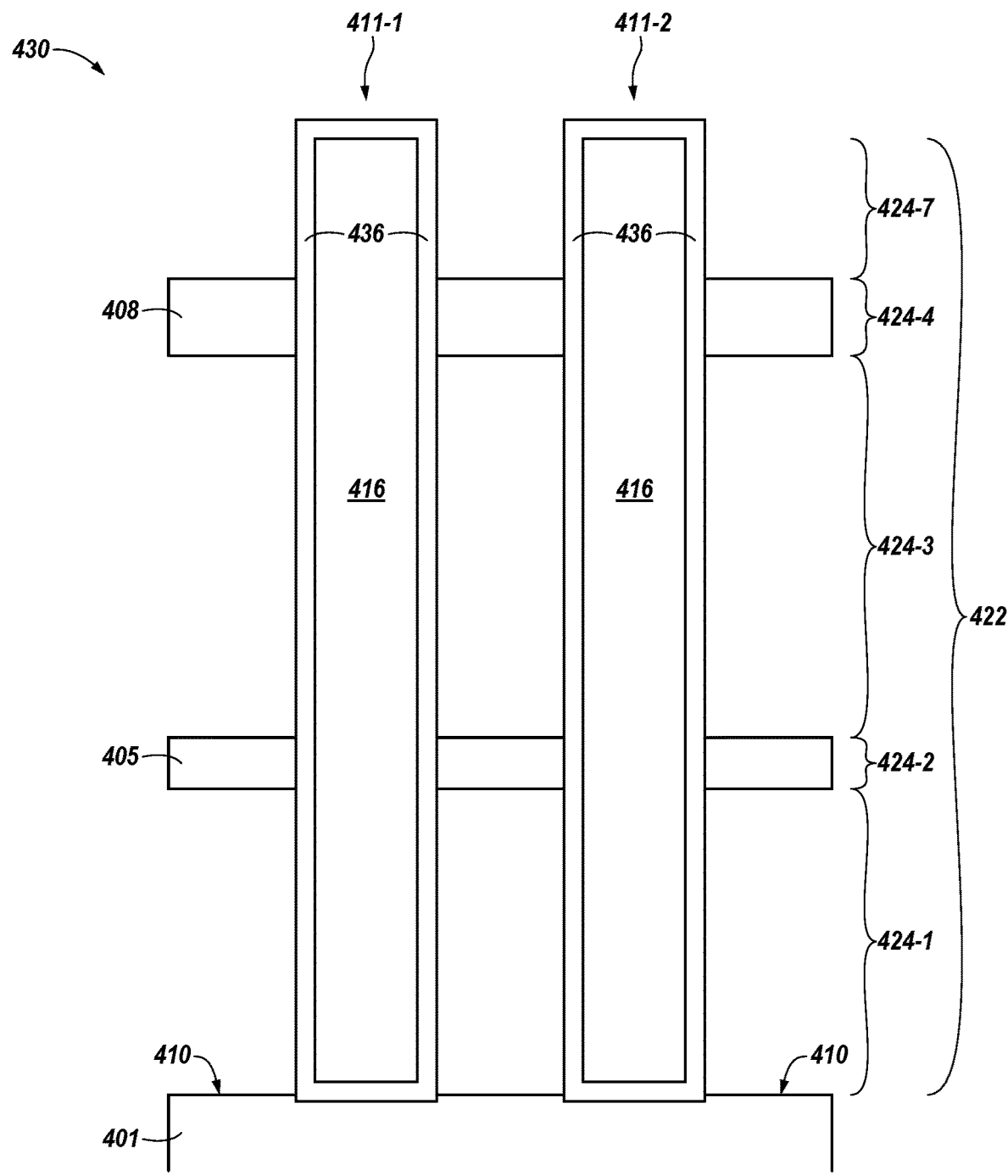

FIG. 4 illustrates a cross-sectional view 430 of a portion of an example memory device at a particular stage in the example fabrication sequence for formation of a capacitor in accordance with a number of embodiments of the present disclosure. FIG. 4 illustrates a structure of the portion of the example memory device at the particular stage following completion of the example fabrication sequence described in connection with FIGS. 1-3.

The first silicate material (e.g., BPSG) shown at 403 in FIG. 4 and the second silicate material (e.g., TEOS) shown at 406 in FIG. 4 have been removed from the portion of the example memory device. The first silicate material 403 and the second silicate material 406 may be removed with (via application of) a solvent that is selective for removing (e.g., dissolving) the first and second silicate materials from the memory device while not removing (e.g., leaving) other materials such that those materials remain in the memory device. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), and combinations thereof, among other possibilities. Removal of the first silicate material 403 and the second silicate material 406 may leave empty spaces (e.g., voids) in the structure of the memory device.

In contrast, the application of the selective solvent may leave the capacitor material 416 having the first electrode material 436 formed over an outer surface thereof remaining in the structure of the memory device. In addition, the first nitride material 405 and the second nitride material 408 may be left remaining following the application of the selective solvent, among other possible components or structural features that may remain in the structure of the memory device. The remaining first nitride material 405 and the remaining second nitride material 408 may function as a capacitor support structure, as described further in connection with FIG. 5, to provide support in view of the voids in the structure of the memory device during the fabrication process.

As is illustrated in FIG. 4, a height 422 of the capacitor material 416 can include a height 424-4 and 424-2 of the first nitride material 405 and the second nitride material 408 along with heights 424-1, 424-3, and 424-5 of the removed sacrificial material, the second silicate material, and the first silicate material, respectively During at least one of the stages described in association with FIGS. 3-4, a portion of the capacitor material 416, along with the first electrode material 436 on an upper surface of the second nitride material 408, may have been removed (e.g., etched). More of the first electrode material 436 may have been formed (e.g., deposited) on upper surfaces of remaining portions of the capacitor material 416, such that the capacitor material 416 is covered on all surfaces with the first electrode material 436. An upper surface of the first electrode material 436 may, in a number of embodiments, be coplanar with the upper surface of the second nitride material 408 such that a height 422 of the capacitor material 416 covered by the first electrode material 436 may be the same as the height of the original opening. As an example, the height 422 of the capacitor material 416 spans the height 424-5 of the removed first silicate material, the height 424-4 of the first nitride material 405, the height 424-3 of the removed second silicate material, the height 424-2 of the second nitride material 408, and the height 424-1 of the removed sacrificial material.

Figure 5:
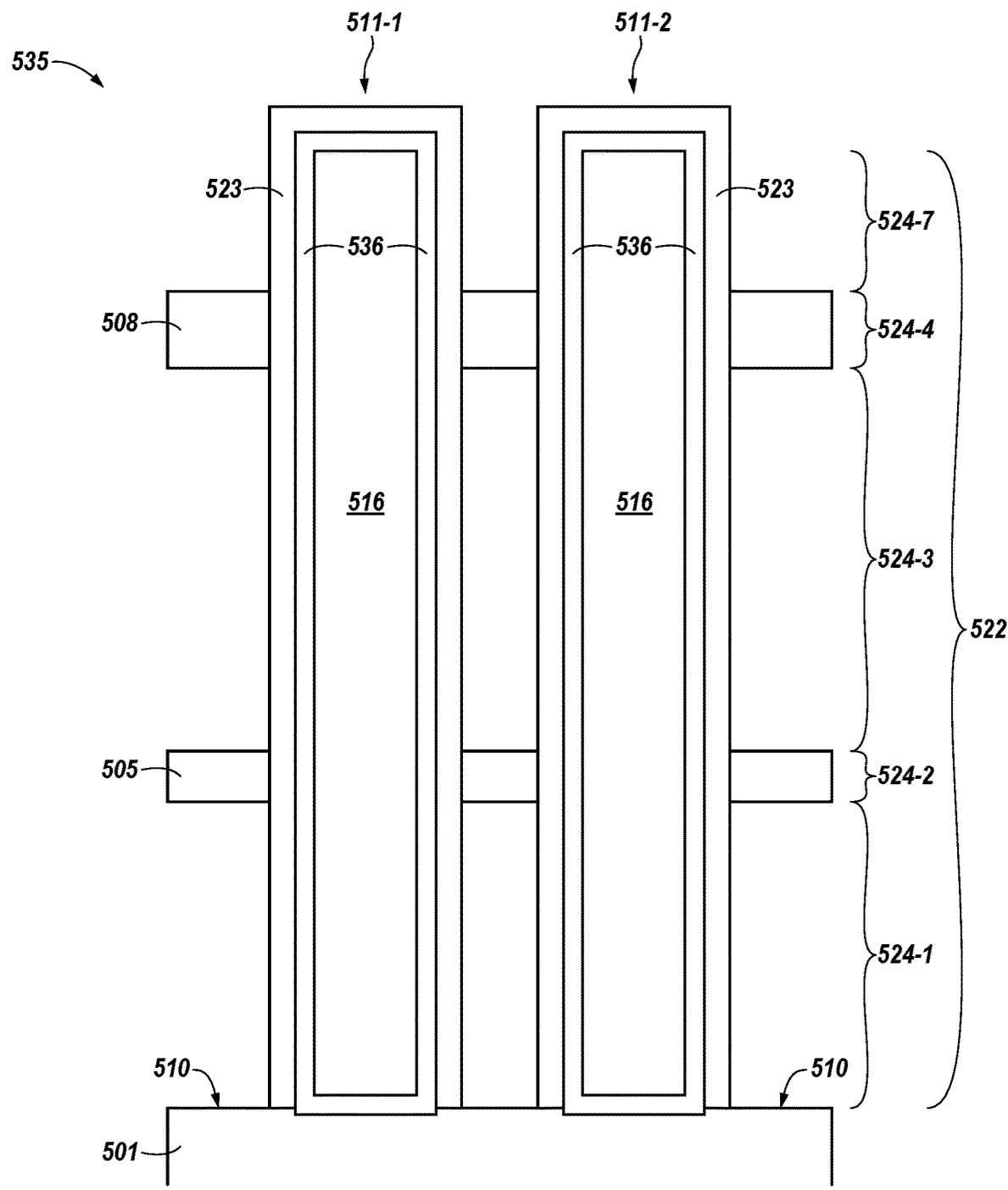

FIG. 5 illustrates a cross-sectional view 535 of a portion of an example memory device at a particular stage in the example fabrication sequence for formation of a capacitor in accordance with a number of embodiments of the present disclosure. FIG. 5 illustrates a structure of the portion of the example memory device following completion of the example fabrication sequence described in connection with FIGS. 1-4.

As shown, a dielectric material 523 has been formed (e.g., deposited) on an outer surface of the first electrode material 536. The dielectric material 523 may, in a number of embodiments, be formed from a surface 510 of the substrate material 501 to cover the outer surface, including an upper surface, of the first electrode material 536.

As is illustrated in FIG. 5, a height 522 of the capacitor material 516 can include a height 524-4 and 524-2 of the first nitride material 505 and the second nitride material 508 along with heights 524-1, 524-3, and 524-5 of the removed sacrificial material, the second silicate material, and the first silicate material, respectively.

Figure 6:
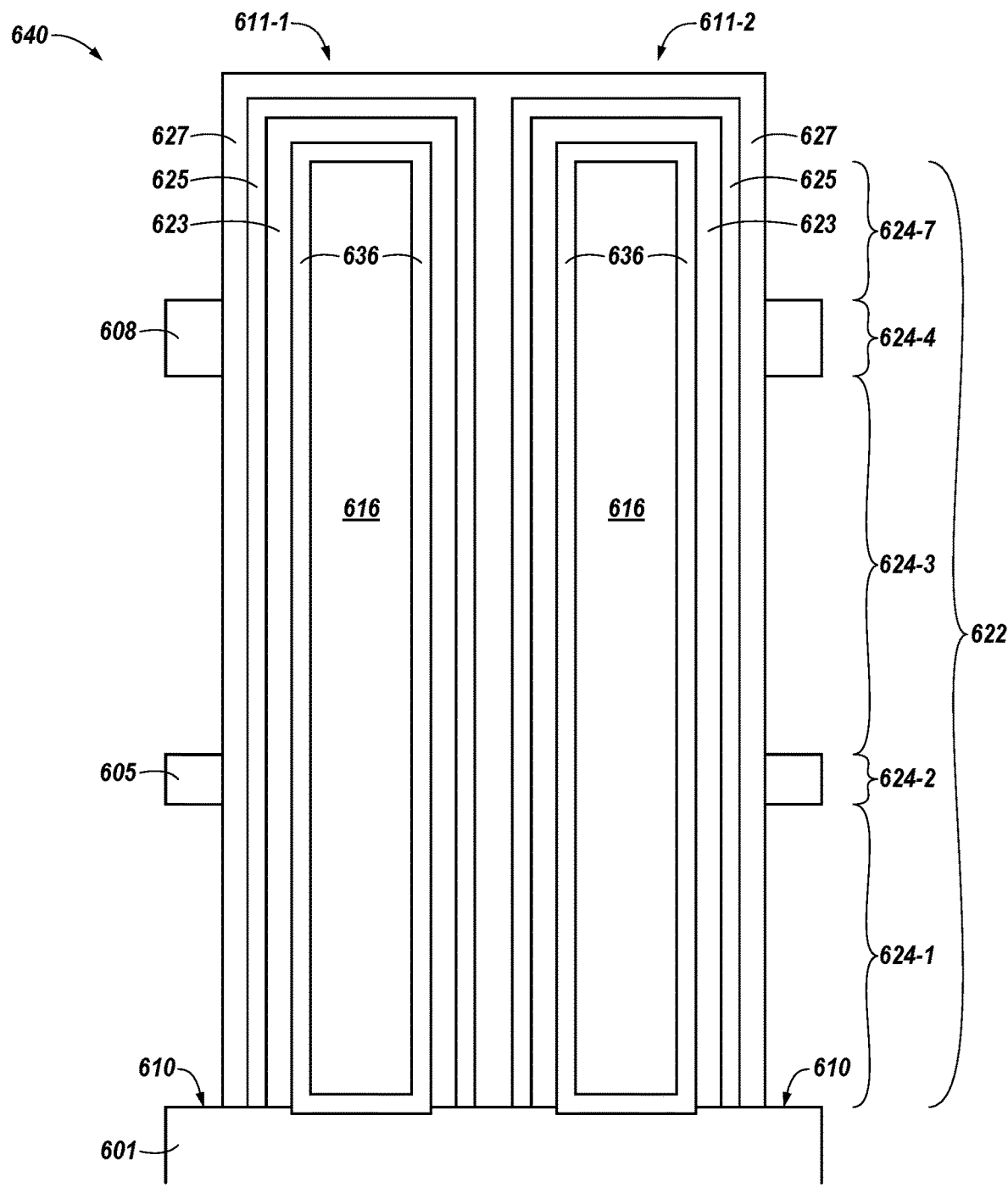

FIG. 6 illustrates a cross-sectional view 640 of a portion of an example memory device at a particular stage in the example fabrication sequence for formation of a capacitor in accordance with a number of embodiments of the present disclosure. FIG. 6 illustrates a structure of the portion of the example memory device following completion of the example fabrication sequence described in connection with FIGS. 1-5.

As shown, the dielectric material 623 has been formed (e.g., deposited) on an outer surface of the first electrode material 636. The dielectric material 623 may, in a number of embodiments, be formed from a surface 610 of the substrate material 601 to cover the outer surface, including an upper surface, of the first electrode material 636. A capacitor 611 may be subsequently formed, at least in part, by formation (e.g., deposition) of a second electrode material 625 on an outer surface of the dielectric material 623.

As is illustrated in FIG. 6, a height 622 of the capacitor material 1159 can include a height 624-4 and 624-2 of the first nitride material 605 and the second nitride material 608 along with heights 624-1, 624-3, and 624-5 of the removed sacrificial material, the second silicate material, and the first silicate material, respectively.

The portion of the example memory device illustrated in FIG. 6 shows a first capacitor 611-1 and a second capacitor 611-2 indicated as widths in the structure and formed as just described. A height 622 of the capacitors 611-1, 611-2 may be higher than the height of the original opening due to the dielectric material 623 and second electrode material 625 being formed over the first electrode material 636. The example memory device illustrated in FIG. 6 shows a buffer material 627 that may be formed around and between the first and second capacitors 611-1, 611-2 as electrical insulation. The dielectric material 623, the second electrode material 625, and the buffer material 627 may be formed from various respective dielectric materials, conductive materials, and resistive materials and to various widths (e.g., thicknesses) as suited to a particular design rule for formation of an operable capacitor for a semiconductor device.

The support structure is formed from the first nitride material 605 and the second nitride material 608, in addition to the underlying substrate material 601. The support structure may provide support to the first and second capacitors 611-1, 611-2 after the removal of the first and second silicate materials 303, 306 has left voids in the structure of the memory device during the fabrication process and even after such voids may have been at least partially filled by the buffer material 627. The support structure formed from the first and second nitride materials 605, 608 is shown, for ease of illustration in what can be a 3D cross sectional view, to be attached to the left side of the first electrode material 636 for capacitor 611-1 and the right side of the first electrode material 636 for capacitor 611-2. However, the support structure formed from the first and second nitride materials 605, 608 also may be on the opposite sides, or may be attached at four position or even surround, the first and second capacitors 611-1, 611-2. In a number of embodiments, the dielectric material 623, the second electrode material 625, and/or the buffer material 627 may surround the first electrode material 636 of the capacitors 611-1, 611-2 except at defined positions where the first and second nitride materials 605, 608 of the support structure are attached to the first electrode material 636.

Formation of the capacitors and a capacitor support structure as just described may enable each of the capacitors to be maintained in a static configuration (e.g., relative to each other and the underlying material). For example, the capacitor support structure may reduce (e.g., prevent) a possibility of a capacitor bending and/or twisting during fabrication or use. By including a sacrificial material, as described herein, a particular height of the capacitor can be supported without sacrificing exposure of surface area of the capacitors while reducing wobbling, bending, and/or twisting created by an etch process for features with such high aspect ratios. Further, the reduction in bending and/or twisting of the capacitors may reduce a possibility of unintended consequences, such as operational failure of the semiconductor device, need to replace parts, etc.

Figure 7:
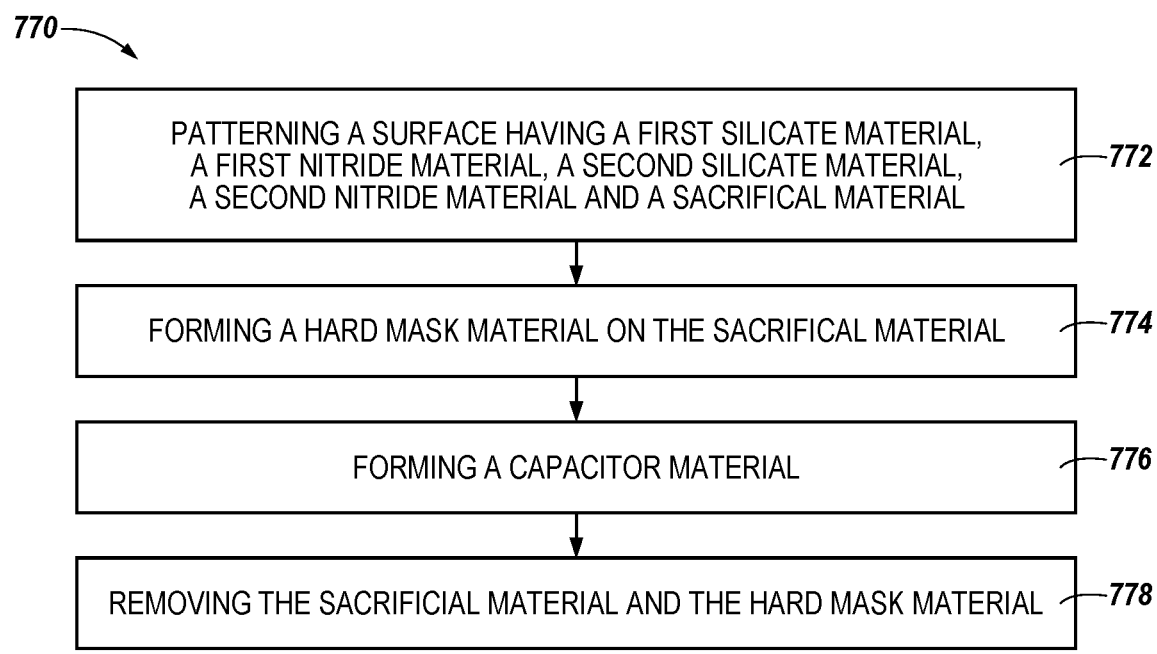
FIGS. 7-9 are flow diagrams of example methods for fabrication sequence for formation of a capacitor using a hard mask in accordance with a number of embodiments of the present disclosure.

Formation of the capacitors and capacitor support structure as just described may be utilized in fabrication of a memory device that includes at least one memory cell. Such a memory cell may include at least one such capacitor, as a data storage element, that is supported by the capacitor support structure. The memory cell also may include at least one access device (e.g., transistor) (not shown) that is, or may be, coupled to the at least one capacitor. The formed capacitor of the memory cell can provide additional capacitance due to an increased height of the capacitor material, as described in association with FIGS. 1-6 above. In some embodiments, the capacitance of the capacitor material can provide between 0.5 fF/cell capacitance and 0.8 fF/cell capacitance. In some embodiments, the capacitance of the capacitor material can provide between 0.65 and 0.7 fF/cell. In some embodiments, the capacitance of the capacitor material can provide at least 0.65 fF/cell, at least 0.67 fF/cell, and at least 0.68 fF/cell. The height of the hard mask material can be varied in order to reach particular threshold capacitances while maintaining a balance between height of the capacitor material and an amount of wobbling and/or bending that may occur at a particular height. allig FIG. 7 is a flow diagram of an example method 770 for formation of a capacitor by using a hard mask material in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 772, the method 770 may include patterning a surface having a first silicate material, a first nitride material, a second silicate material, a second nitride material, and a sacrificial material. The first silicate material may, in a number of embodiments, have been formed from a borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, formation, and/or removal of the first silicate material, as described herein.

The first nitride material may be formed from a nitride material selected for dielectric or resistance properties. For example, one or more dielectric and/or resistor nitrides may be selected from boron nitride (BN), silicon nitride ($SiN_x$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material. The first nitride material may, in a number of embodiments, be deposited to a thickness in a range of from around 15 nm to around 30 nm above the surface of the first silicate material.

The second silicate material may, in a number of embodiments, be formed from tetraethyl orthosilicate ($Si(OC_2H_5)_4$), which is also referred to as TEOS. TEOS may be formed as an ethyl ester of orthosilicic acid ($Si(OH)_4$), among other possibilities.

Similar to the first nitride material, the second nitride material may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the second nitride material. In various embodiments, the first nitride material and the second nitride material may be formed from a same nitride or a same mixture of nitrides or the first and second nitride materials each may be formed from a different nitride or a different mixture of nitrides dependent upon, for example, various uses to which the nitrides may be applied. The second nitride material may, in a number of embodiments, be deposited to a thickness in a range of from around 80 nm to around 150 nm above the surface of the second silicate material.

In at least one embodiment, the sacrificial material may be a third nitride material. In at least one embodiment, the sacrificial material can be a different nitride material than the second nitride material. In at least one embodiment, the sacrificial material can be a same nitride material than the second nitride material. Similar to the first nitride material and the second nitride material, the sacrificial material may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the sacrificial material.

At block 774, the method 770 may include forming a hard mask material on the sacrificial material. In at least one embodiment, the hard mask material may be a material that does not etch faster when exposed to plasma based etching. A hard mask material can be a material used to protect an area beneath from etching when exposed to plasma based etching. In one example, the hard mask material can be deposited to a height of approximately 1,200 Angstroms. In at least one embodiment, the hard mask material can be a different nitride material than the second nitride material. In at least one embodiment, the hard mask material can be a same nitride material as the sacrificial material.

At block 776, the method 770 may include forming a capacitor material. At block 778, the method 770 may include removing the sacrificial material and the hard mask material. The sacrificial material and the hard mask material can be removed to expose a top portion of the capacitor material. The method 770 may further include forming the first and second silicate materials from different silicate materials (e.g., as described in connection with FIG. 1).

Figure 8:
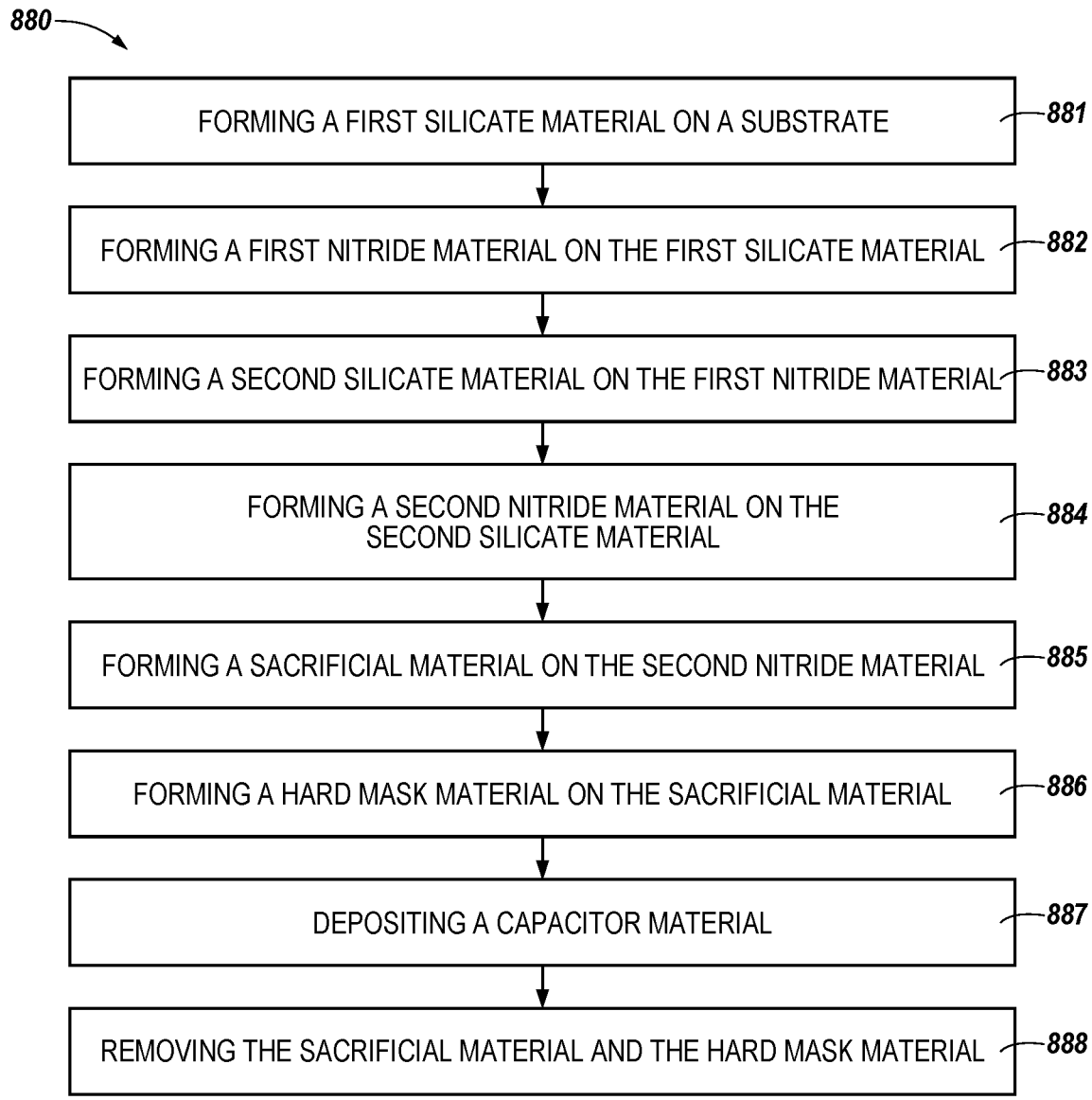

FIG. 8 is a flow diagram of an example method 880 for formation of a capacitor by using a hard mask material in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 881, the method 880 may include forming a first silicate material on a substrate. The first silicate material may, in a number of embodiments, have been formed from a borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities.

At block 882, the method 880 may include forming a first nitride material on the first silicate material. The first nitride material may be formed from a nitride material selected for dielectric or resistance properties. For example, one or more dielectric and/or resistor nitrides may be selected from boron nitride (BN), silicon nitride ($SiN_x$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material. The first nitride material may, in a number of embodiments, be deposited to a thickness in a range of from around 15 nm to around 30 nm above the surface of the first silicate material.

At block 883, the method 880 may include forming a second silicate material on the first nitride material. The second silicate material may, in a number of embodiments, be formed from tetraethyl orthosilicate ($Si(OC_2H_5)_4$), which is also referred to as TEOS. TEOS may be formed as an ethyl ester of orthosilicic acid ($Si(OH)_4$), among other possibilities.

At block 884, the method 880 may include forming a second nitride material on the second silicate material. Similar to the first nitride material, the second nitride material may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the second nitride material.

At block 885, the method 880 may include forming a sacrificial material on the second nitride material. In at least one embodiment, the sacrificial material may be a third nitride material. In at least one embodiment, the sacrificial material can be a different nitride material than the second nitride material. In at least one embodiment, the sacrificial material can be a same nitride material than the second nitride material. Similar to the first nitride material and the second nitride material, the sacrificial material may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the sacrificial material.

At block 886, the method 880 may include forming a hard mask material on the sacrificial material. In one example, the hard mask material can be deposited to a height of approximately 1,200 Angstroms. In at least one embodiment, the hard mask material can be a different nitride material than the second nitride material. In at least one embodiment, the hard mask material can be a same nitride material as the sacrificial material.

At block 887, the method 880 may include depositing a plurality of columns of capacitor material. As an example, a plurality of openings can be etched out of the first silicate material, the first nitride material, the second silicate material, the second nitride material, and the sacrificial material, resulting in a plurality of openings in the materials. A capacitor material can be deposited within the etched openings, resulting in the plurality of columns of capacitor material.

At block 888, the method 880 may include removing the sacrificial material and the hard mask material to expose a top portion of each of the plurality of columns of capacitor material. Removing the sacrificial material and the hard mask material can increase a surface area of exposure of the plurality of columns of capacitor material, thereby increasing the functionality of the capacitor material and/or a capacitor formed from the capacitor material of a memory device.

Figure 9:
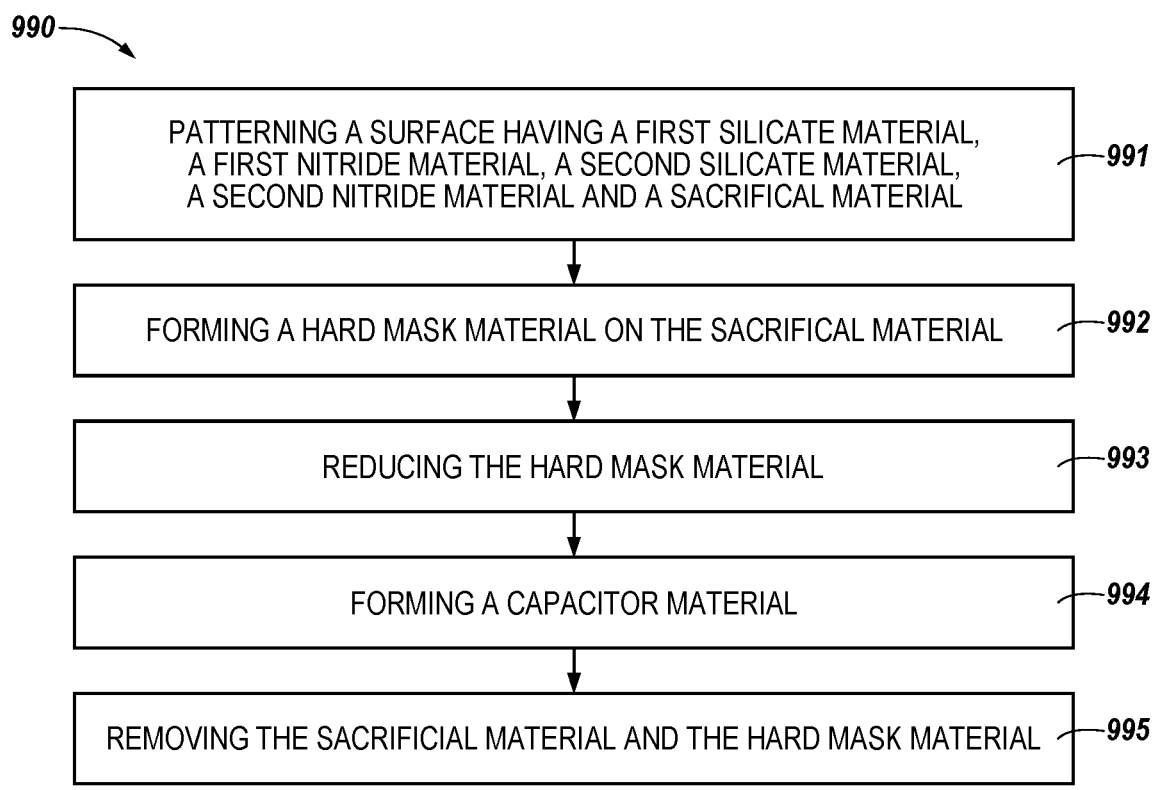

FIG. 9 is a flow diagram of an example method 990 for formation of a capacitor by using a hard mask material in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 991, the method 990 may include patterning a surface having a first silicate material, a first nitride material, a second silicate material, a second nitride material, and a sacrificial material. The first silicate material can be on a substrate, the first nitride material can be on the first silicate material, the second silicate material can be on the first nitride material, the second nitride material can be on the second silicate material, and the sacrificial material can be on the second nitride material.

The first silicate material may, in a number of embodiments, have been formed from a borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, formation, and/or removal of the first silicate material, as described herein.

The first nitride material may be formed from a nitride material selected for dielectric or resistance properties. For example, one or more dielectric and/or resistor nitrides may be selected from boron nitride (BN), silicon nitride ($SiN_x$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material. The first nitride material may, in a number of embodiments, be deposited to a thickness in a range of from around 15 nm to around 30 nm above the surface of the first silicate material.

The second silicate material may, in a number of embodiments, be formed from tetraethyl orthosilicate ($Si(OC_2H_5)_4$), which is also referred to as TEOS. TEOS may be formed as an ethyl ester of orthosilicic acid ($Si(OH)_4$), among other possibilities.

Similar to the first nitride material, the second nitride material may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the second nitride material. In various embodiments, the first nitride material and the second nitride material may be formed from a same nitride or a same mixture of nitrides or the first and second nitride materials each may be formed from a different nitride or a different mixture of nitrides dependent upon, for example, various uses to which the nitrides may be applied. The second nitride material may, in a number of embodiments, be deposited to a thickness in a range of from around 80 nm to around 150 nm above the surface of the second silicate material.

In at least one embodiment, the sacrificial material may be a third nitride material. In at least one embodiment, the sacrificial material can be a different nitride material than the second nitride material. In at least one embodiment, the sacrificial material can be a same nitride material than the second nitride material. Similar to the first nitride material and the second nitride material, the sacrificial material may be formed from a nitride material selected for dielectric or resistance properties. For example, one or more dielectric and/or resistor nitrides may be selected from BN, $SiN_x$, $Si_3N_4$, AlN, GN, TaN, $Ta_2N$, TiN, $Ti_2N$), and WN, $W_2N$, $WN_2$, among other possibilities, for formation of the sacrificial material.

At block 992, the method 990 may include forming a hard mask material on the sacrificial material. In one example, the hard mask material can be deposited to a height of approximately 1,200 Angstroms. In at least one embodiment, the hard mask material can be a different nitride material than the second nitride material. In at least one embodiment, the hard mask material can be a same nitride material as the sacrificial material.

At block 993, the method 990 may include removing a portion of the hard mask material. A portion of the hard mask material may be removed with (via application of) a solvent that is selective for removing (e.g., dissolving) the hard mask material 214 from the memory device while not removing (e.g., leaving) other portions of the hard mask materials along with other materials such that those materials remain in the memory device (such as not removing the first silicate material, the first nitride material, the second silicate material, the second nitride material, the sacrificial layer, and a portion of the hard mask material). Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), ammonium hydroxide ($NH_4OH$), tetramethylammonium hydroxide (TMAH), nitric acid ($HNO_3$), hydrogen chloride (HCL), hydrogen peroxide ($H_2O_2$), potassium hydroxide (KOH), phosphoric acid, hot hydrofluoric acid (HF), cold HF, and combinations thereof, among other possibilities.

In some embodiments, a CMP and/or an alligator cut can be used to planarize and reduce a portion of the hard mask material to a particular height of the hard mask material. This can reduce the height of the hard mask material from 1200 Angstroms to 500 Angstroms. In some embodiments, the height of the hard mask material can be reduced from a range of 1000-2000 Angstroms to a height in a range from 200-1000 Anstroms. The remaining hard mask material can provide additional height to a capacitor material that is deposited, as will be described further below.

The portion of the hard mask material removed can include removing a height of between 500-1000 Angstroms from the hard mask material. As an example, the height of the hard mask material (such as in FIG. 1) can be 1200 Angstroms while the height, subsequent to the removal of the portion of the hard mask material, can be 700 Angstroms. Further, the height of the hard mask material prior to removal can be from a range of 500-1500 Angstroms and the height of the had mask material subsequent to removal of the portion can be from a range of 500-1200 Angstroms. In this way, a height of a capacitor material, whose deposition will be described, can be increased.

At block 994, the method 990 may include forming a column of capacitor material. As an example, a column can be etched out of the BPSG material, the first nitride material, the TEOS material, the second nitride material, and the sacrificial material, resulting in an opening in the materials. A capacitor material can be deposited within the etched opening, resulting in the column of capacitor material.

At block 995, the method 990 may include removing the sacrificial material and the hard mask material to expose a top portion of the capacitor material. Removing the sacrificial material and the hard mask material can increase a surface area of exposure of the capacitor material, thereby increasing the functionality of the capacitor material and/or a capacitor formed from the capacitor material of a memory device.

Figure 10:
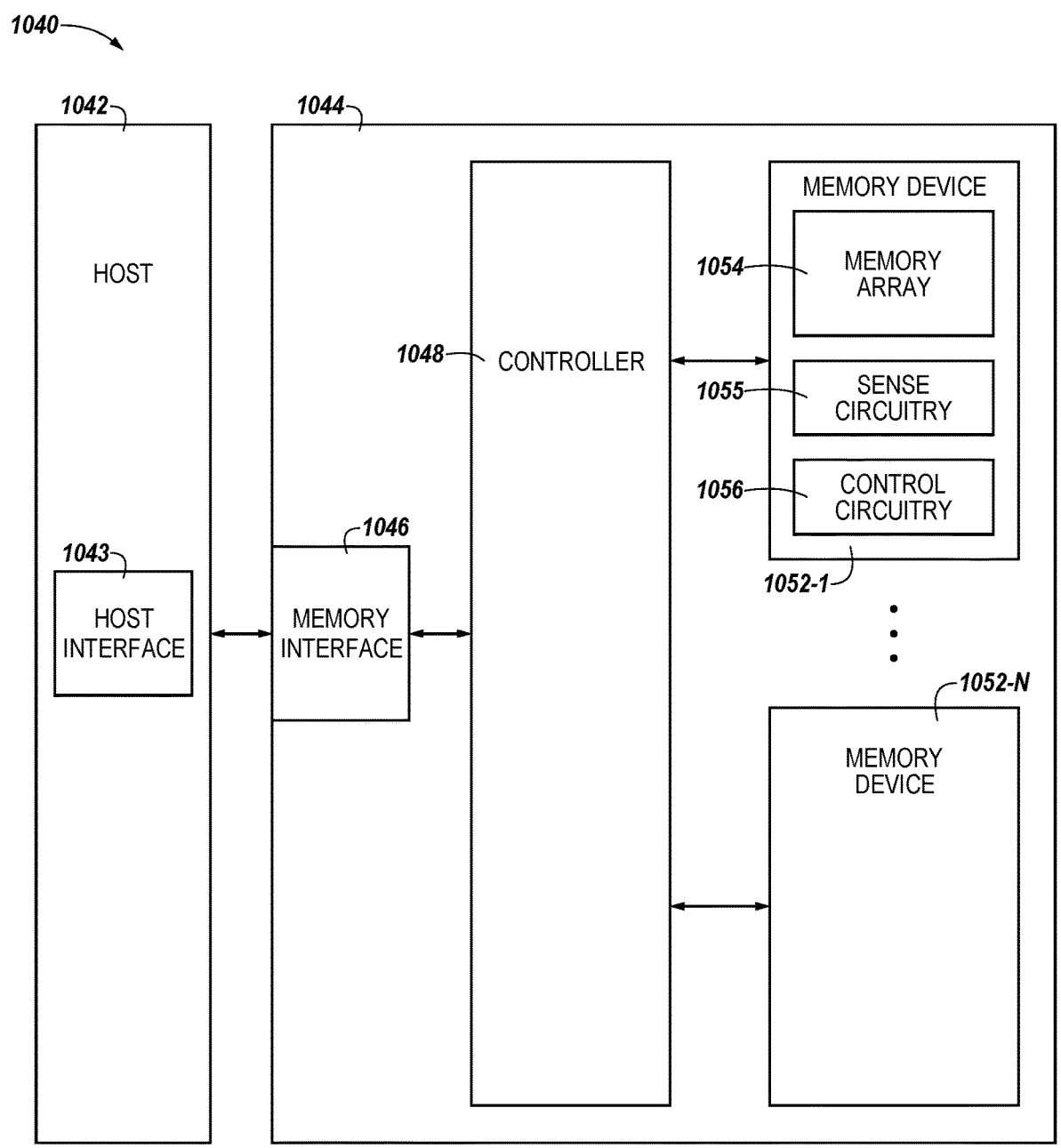
FIG. 10 is a functional block diagram of a computing system including at least one memory system in accordance with one or more embodiments of the present disclosure.

FIG. 10 is a functional block diagram of a computing system 1040 including at least one memory system 1044 in accordance with one or more embodiments of the present disclosure. Memory system 1044 may be, for example, a solid-state drive (SSD).

In the embodiment illustrated in FIG. 5, memory system 1044 includes a memory interface 1046, a number of memory devices 1052-1, . . . , 1052-N, and a controller 1048 selectably coupled to the memory interface 1046 and memory devices 1052-1, . . . , 1052-N. Memory interface 1046 may be used to communicate information between memory system 1044 and another device, such as a host 1042. Host 1042 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 1042 may be associated with fabrication operations performed on semiconductor devices and/or SSDs.

In a number of embodiments, host 1042 may be associated with (e.g., include or be coupled to) a host interface 1043. The host interface 1043 may enable input of scaled preferences (e.g., in numerically and/or structurally defined gradients) to define, for example, critical dimensions (CDs) of a final structure or intermediary structures of a memory device (e.g., as shown at 1052) and/or an array of memory cells (e.g., as shown at 1054) formed thereon to be implemented by a processing apparatus. The scaled preferences may be provided to the host interface 1043 via input of a number of preferences stored by the host 1042, input of preferences from another storage system (not shown), and/or input of preferences by a user (e.g., a human operator).

Memory interface 1046 may be in the form of a standardized physical interface. For example, when memory system 1044 is used for information (e.g., data) storage in computing system 1040, memory interface 1046 may be a serial advanced technology attachment (SATA) interface, a peripheral component interconnect express (PCIe) interface, or a universal serial bus (USB) interface, among other physical connectors and/or interfaces. In general, however, memory interface 1046 may provide an interface for passing control, address, information, scaled preferences, and/or other signals between the controller 1048 of memory system 1044 and a host 1042 (e.g., via host interface 1043).

Controller 1048 may include, for example, firmware and/or control circuitry (e.g., hardware). Controller 1048 may be operably coupled to and/or included on the same physical device (e.g., a die) as one or more of the memory devices 1052-1, . . . , 1052-N. For example, controller 1048 may be, or may include, an ASIC as hardware operably coupled to circuitry (e.g., a printed circuit board) including memory interface 1046 and memory devices 1052-1, . . . , 1052-N. Alternatively, controller 1048 may be included on a separate physical device that is communicatively coupled to the physical device (e.g., the die) that includes one or more of the memory devices 1052-1, . . . , 1052-N.

Controller 1048 may communicate with memory devices 1052-1, . . . , 1052-N to direct operations to sense (e.g., read), program (e.g., write), and/or erase information, among other functions and/or operations for management of memory cells. Controller 1048 may have circuitry that may include a number of integrated circuits and/or discrete components. In a number of embodiments, the circuitry in controller 1048 may include control circuitry for controlling access across memory devices 1052-1, . . . , 1052-N and/or circuitry for providing a translation layer between host 1042 and memory system 1044.

Memory devices 1052-1, . . . , 1052-N may include, for example, a number of memory arrays 1054 (e.g., arrays of volatile and/or non-volatile memory cells). For instance, memory devices 1052-1, . . . , 1052-N may include arrays of memory cells, such as a portion of an example memory device 1150 structured to include pillars and adjacent trenches described in connection with FIG. 11 to form capacitors formed according to embodiments described in FIGS. 1-9. As will be appreciated, the memory cells in the memory arrays 1054 of memory devices 1052-1, . . . , 1052-N and/or as shown at 1150 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 1052, 1150 may be formed on the same die. A memory device (e.g., memory device 1052-1) may include one or more arrays 1054 of memory cells formed on the die. A memory device may include sense circuitry 1055 and control circuitry 1056 associated with one or more arrays 1054 formed on the die, or portions thereof. The sense circuitry 1055 may be utilized to determine (sense) a particular data value (e.g., 0 or 1) that is stored at a particular memory cell in a row of an array 1054. The control circuitry 1056 may be utilized to direct the sense circuitry 1055 to sense particular data values, in addition to directing storage, erasure, etc., of data values in response to a command from host 1042 and/or host interface 1043. The command may be sent directly to the control circuitry 1056 via the memory interface 1046 or to the control circuitry 1056 via the controller 1048.

The embodiment illustrated in FIG. 5 may include additional circuitry that is not illustrated so as not to obscure embodiments of the present disclosure. For example, memory devices 1052, 1150 may include address circuitry to latch address signals provided over I/O connectors through I/O circuitry. Address signals may be received and decoded by a row decoder and a column decoder to access a memory array 1054. It will be appreciated that the number of address input connectors may depend on the density and/or architecture of memory devices 1052, 1150 and/or memory arrays 1054.

Figure 11:
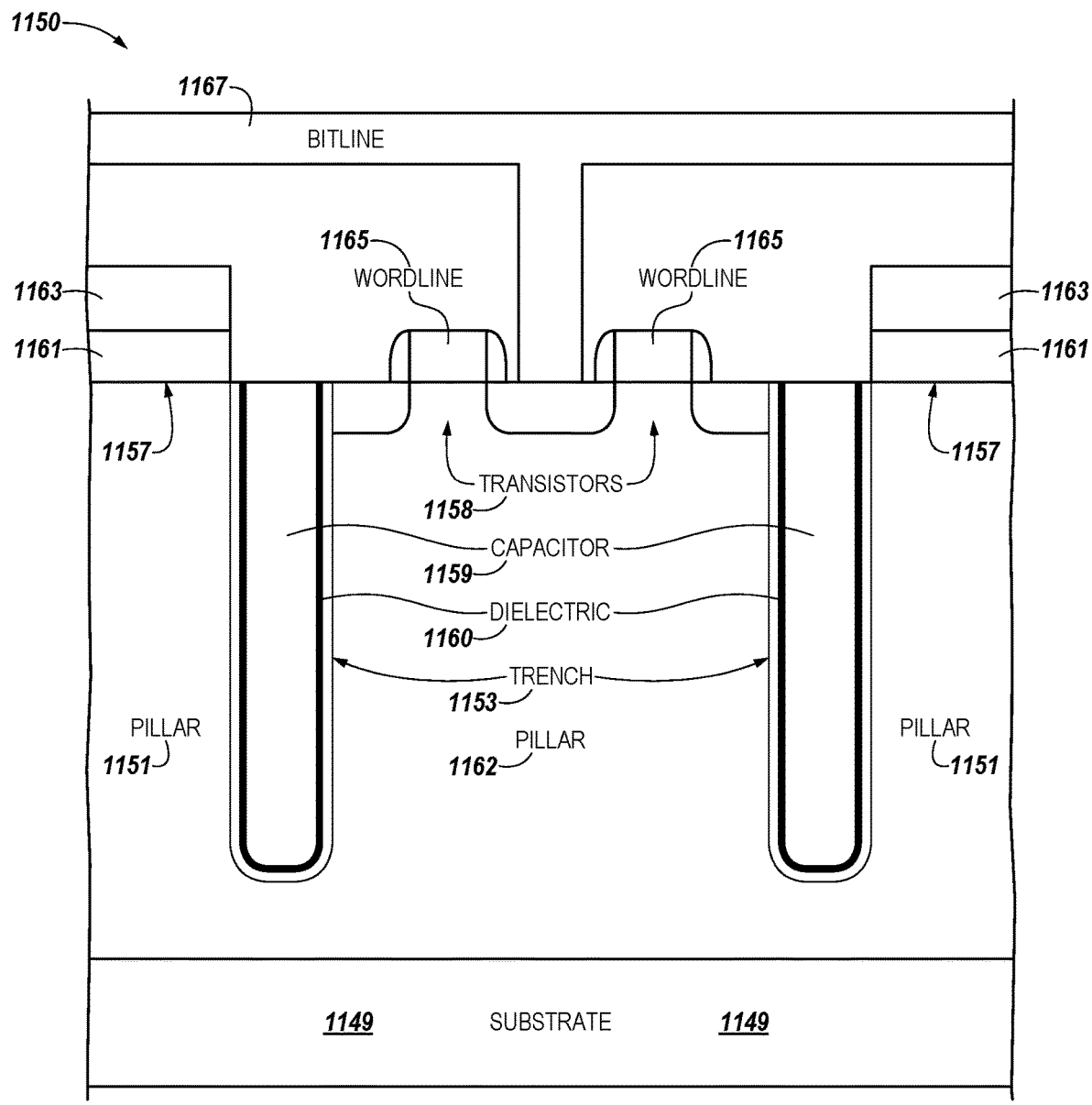
FIG. 11 illustrates a cross-sectional view of a portion of an example of semiconductor structures of a memory device that include pillars and adjacent trenches in accordance with a number of embodiments of the present disclosure.

FIG. 11 illustrates a cross-sectional view of a portion of an example of semiconductor structures of a memory device 1150 that include pillars and adjacent trenches to form capacitors formed according to embodiments described in FIGS. 1-9 in accordance with a number of embodiments of the present disclosure. The portion of the memory device 1150 illustrated in FIG. 11 is shown by way of example and not by way of limitation to include a DRAM memory cell architecture. Another RAM, flash (e.g., NAND or NOR), and/or 3D memory cell architecture also may include pillars and adjacent trenches. Embodiments are not so limited. Although the DRAM transistors 1158 and capacitors 1159 are shown to be arranged in a lateral configuration, embodiments may include the transistors 1158 and capacitors 1159 being arranged in a lateral, a vertical, or other configurations.

The portion of the memory device 1150 shown in FIG. 6 may represent two DRAM memory cells in a 1T1C (one transistor one capacitor) configuration or one DRAM memory cell in a 2T2C configuration. DRAM memory cells may utilize capacitors 1159 each formed in a trench 1153 to store a particular charge corresponding to a data value. Forming the trenches 1153 as shown in FIG. 11 may result in a pillar 1162 being formed from the etched material on each side of a trench 1153. Pillars 1162 may be formed (e.g., fabricated) as layers of doped or undoped semiconductor material deposited on a substrate material 1149. The semiconductor material may be etched to form the pillars 1162 and trenches 1153. In some embodiments, an opening (e.g., a round, square, oblong, etc., opening rather than a rectilinear trench) may be etched into the semiconductor material and capacitor material may be deposited in the opening, although such a configuration does not affect the concept of passivation material for pillars adjacent a trench described herein.

Moreover, embodiments of the present disclosure are not limited to capacitors being formed in a trench for data storage, nor are embodiments limited to the trench containing capacitor material. For example, various types of memory devices may include trenches between sidewall structures (e.g., pillars), formed according to embodiments described in FIGS. 1-9, in which various materials may be positioned to contribute to data access, storage, and/or processing or in which various materials may be formed for electrical conduction and/or isolation (e.g., conductor, resistor, and/or dielectric materials), among other functions and/or operations.

In a number of embodiments, a trench 1153 may be etched to a particular depth into a pillar material. The trench 1153 may be etched into the material of the pillars 1162 to a depth approaching the substrate material 1149, as shown in FIG. 11. Alternatively, the trench 1153 may be etched into the material of the pillars 1151 to a top of or into the substrate material 1149. The depth of the trench 1153 approaching, at the top of, and/or into the substrate material 1149 is termed herein as being in the bottom region of the trench.

As described herein, deepening (e.g., etching) the trench further into the pillar material or the substrate material, according to embodiments described herein, may increase a surface area of the trench boundaries. In one example, increasing the surface area of the trench boundaries may increase a capacitance of a capacitor 1159 formed in the trench 1153 (e.g., by increasing a volume and/or surface area of the capacitor). In this example, the trench 1153 may be lined with a dielectric material 1160 and a capacitor material may be formed (e.g., deposited) within the trench 1153 and on the dielectric material 1160 to form the capacitor 1159 in FIG. 11 to a particular (e.g., target) depth.

Each pillar 1162 of the pillar material may extend to a particular height (e.g., as shown at 122 and described in connection with FIG. 1) above the substrate material 101. As such, each pillar 1162 has a top surface 1157 at the particular height. A number of structural materials may be formed on or in association with the top surface 1157 of the pillar 1162 adjacent the trench 1153. For example, a particular material 1161 may be formed to contribute to data access, storage, and/or processing (e.g., conductor, resistor, and/or dielectric materials). Such a material 1161 may be formed over the top surface 1157 of the pillar 1162 adjacent the trench 1153. A mask material 1163 may be formed to protect an underlying material 1161 and/or the top surface 1157 of the pillar 1162 adjacent the trench 1153 from subsequent processing and/or wear encountered in use of the memory device 1150. Other structural materials that may be formed (e.g., in a DRAM configuration as shown in FIG. 11) on or in association with the top surface 1157 of the pillar 1162 adjacent the trench 1153. The other structural materials may include the transistors 1158, wordlines 1165, and/or bitlines 1167, among other possible structural materials. The structural materials just described as being formed on and/or in association with the top surface 1157 of the pillar 1162 adjacent the trench 1153 are termed herein as being in a top region of the pillar 1162 and/or trench 1153.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to formation of a capacitor using a sacrificial material have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to use of a sacrificial material in formation of a capacitor than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   patterning a surface of a semiconductor substrate to have:
   a first silicate material,
   a first nitride material on the first silicate material;
   a second silicate material on the first nitride material;
   a second nitride material on the second silicate material; and
   a sacrificial material on the second nitride material;
   forming a hard mask material on a top surface of the sacrificial material;
   forming a capacitor material in an opening through the first silicate material, the first nitride material, the second silicate material, the second nitride material, the sacrificial material, and the hard mask material, wherein the capacitor material is formed to a height higher than a lowest height of the hard mask that is on the top surface of the sacrificial material;
   removing the sacrificial material and the hard mask material;
   removing the first silicate material and the second silicate material; and
   forming a first electrode material, a dielectric material, a second electrode material, and a buffer material over the capacitor material.

2. The method of claim 1, wherein forming the hard mask material comprises forming the hard mask material to an approximate height of 1,200 Angstroms.

3. The method of claim 2, further comprising reducing the hard mask material to a height of 500 Angstroms.

4. The method of claim 3, wherein reducing the hard mask material comprises reducing the hard mask material using one of a CMP or an alligator cut.

5. The method of claim 1, wherein forming the capacitor material comprises forming the capacitor material to a height of greater than 10,500 Angstroms.

6. The method of claim 5, wherein patterning the surface comprises patterning the surface such that the first silicate material and the second silicate material make up at least 8,600 Angstroms of the height greater than 10,500 Angstroms.

7. The method of claim 1, wherein forming the capacitor material comprises forming the capacitor material to a height greater than 10,500 Angstroms.

8. The method of claim 1, wherein patterning the surface comprises patterning the surface such that a height of each of the first silicate material and the second silicate material is between 2,000 and 6,000 Angstroms.

9. The method of claim 1, wherein patterning the surface comprises patterning the surface such that:
   a height of the first nitride material is between 100 and 400 Angstroms; and
   a height of the second nitride material is between 100 and 1,500 Angstroms.

10. The method of claim 1, wherein patterning the surface comprises patterning the surface such that a height of the sacrificial material is between 100 and 1,500 Angstroms.

11. The method of claim 1, wherein one of the first silicate material and the second silicate material comprises one of a borophosphosilicate glass (BPSG) material and a TEOS material.

12. The method of claim 1, wherein the sacrificial material is one of a nitride material and a silicate material.

13. A method, comprising:
    forming a first silicate material on a semiconductor substrate;
    forming a first nitride material on the first silicate material;
    forming a second silicate material on the first nitride material;
    forming a second nitride material on the second silicate material;
    forming a sacrificial material on the second nitride material;
    forming a hard mask material on the sacrificial material;

depositing a plurality of capacitor material in openings through the formed first silicate material, the first nitride material, the second silicate material, the second nitride material, the sacrificial material, and the hard mask material, wherein each of the plurality of capacitor material is formed to a height higher than the initially formed height of the sacrificial material;

removing the sacrificial material and the hard mask material to expose a side surface of a top portion of each of the plurality of capacitor material;

removing the first silicate material and the second silicate material; and forming a first electrode material, a dielectric material, a second electrode material, and a buffer material over the plurality of capacitor material.

14. The method of claim 13, wherein:
removing the sacrificial material exposes the side surface of each of the plurality of capacitor material along a width of at least 700 Angstroms; and
removing the hard mask material exposes the top portion of each of the plurality of capacitor material along a width of at least 500 Angstroms.

15. The method of claim 13, wherein forming the second nitride material, the sacrificial material, and the hard mask material comprises forming the sacrificial material between the hard mask material and the second nitride material.

16. The method of claim 13, wherein:
forming the sacrificial material comprises depositing the sacrificial material on the second nitride material; and
forming the hard mask material comprises depositing the hard mask material on the sacrificial material.

17. The method of claim 13, wherein removing the hard mask material and the sacrificial material comprises etching the hard mask material and the sacrificial material.

18. The method of claim 13, wherein the sacrificial material includes one of TiSiN and TiN.

19. The method of claim 13, wherein the hard mask material includes one of poly-silicon, carbon, a metal, and nitride.

20. The method of claim 13, further comprising removing the first silicate material and the second silicate material.

21. The method of claim 13, wherein:
one of the first silicate material and the second silicate material is formed from a borophosphosilicate glass (BPSG) material including a silicon compound ($SiO_2$) doped with a boron compound ($B_2O_3$) and a phosphorus compound ($P_2O_5$); and
one of the first silicate material and the second silicate material is formed from a tetraethyl orthosilicate (TEOS) material.

22. A method, comprising:
patterning a surface of a semiconductor substrate to have:
a first silicate material,
a first nitride material on the first silicate material;
a second silicate material on the first nitride material;
a second nitride material on the second silicate material; and
a sacrificial material on the second nitride material;
forming a hard mask material on a top surface of the sacrificial material greater than a height of 800 Angstroms;
reducing the hard mask material to a height between 200 and 800 Angstroms;
forming a capacitor material in an opening through the first silicate material, the first nitride material, the second silicate material, the second nitride material, the sacrificial material, and the hard mask material, wherein the capacitor material is formed within a space between portions of the hard mask material to a height higher than a lowest height of the hard mask that is on the top surface of the sacrificial material;
removing the sacrificial material and the hard mask material;
removing the first silicate material and the second silicate material; and
forming a first electrode material, a dielectric material, a second electrode material, and a buffer material over the capacitor material.

23. The method of claim 22, wherein forming the hard mask material comprises forming the hard mask material to an approximate height of at least 1,000 Angstroms.

24. The method of claim 22, further comprising:
removing, with a selective solvent, the first silicate material and the second silicate material;
leaving the capacitor material; and
leaving the first and second nitride materials as a capacitor support structure.

25. The method of claim 22, further comprising:
removing, with a selective solvent, the first silicate material and the second silicate material;
leaving the capacitor material having the first electrode material formed over an outer surface thereof; and
leaving the first and second nitride materials as a capacitor support structure.

26. A portion of a memory device formed by the method of claim 22, wherein:
the memory device comprises a memory cell that includes:
a capacitor, as a data storage element, that is supported by the capacitor support structure; and
an access device coupled to the at least one capacitor.

* * * * *